(12) United States Patent
Wortberg

(10) Patent No.: US 11,195,639 B2
(45) Date of Patent: Dec. 7, 2021

(54) CONDUCTOR ARRANGEMENT AND PRODUCTION METHOD

(71) Applicant: Lisa Dräxlmaier GmbH, Vilsbiburg (DE)

(72) Inventor: Michael Wortberg, Dorfen (DE)

( * ) Notice: Subject to any disclaimer, the term of this patent is extended or adjusted under 35 U.S.C. 154(b) by 0 days.

(21) Appl. No.: 17/058,341

(22) PCT Filed: Apr. 29, 2019

(86) PCT No.: PCT/EP2019/060904
§ 371 (c)(1),
(2) Date: Nov. 24, 2020

(87) PCT Pub. No.: WO2019/223958
PCT Pub. Date: Nov. 28, 2019

(65) Prior Publication Data
US 2021/0202130 A1    Jul. 1, 2021

(30) Foreign Application Priority Data
May 24, 2018   (DE) .......................... 102018112478.3

(51) Int. Cl.
*H05K 1/02*     (2006.01)
*H05K 3/10*     (2006.01)
*H01B 7/08*     (2006.01)

(52) U.S. Cl.
CPC ......... *H01B 7/0846* (2013.01); *H05K 1/0245* (2013.01); *H05K 3/10* (2013.01);
(Continued)

(58) Field of Classification Search
CPC ... H05K 1/024–0253; H05K 3/10; H05K 3/12
See application file for complete search history.

(56) References Cited

U.S. PATENT DOCUMENTS

| | | | |
|---|---|---|---|
| 5,764,489 | A | 6/1998 | Leigh et al. |
| 7,709,741 | B2 | 5/2010 | Reichert et al. |
| | | (Continued) | |

FOREIGN PATENT DOCUMENTS

| | | | |
|---|---|---|---|
| DE | | 2445534 A2 | 4/1976 |
| DE | | 10331710 B4 | 5/2008 |
| DE | 10 2018 112 478 B3 | | 11/2019 |

OTHER PUBLICATIONS

DE 102018112478.3 Decision to Grant by the German Patent Office dated Jul. 8, 2019 in the German language.
(Continued)

*Primary Examiner* — Jeremy C Norris
(74) *Attorney, Agent, or Firm* — Jacob Eisenberg

(57) ABSTRACT

The present disclosure provides a conductor arrangement for transmitting differential communication signals, the conductor arrangement includes a conductor carrier, a plurality of pairs of first conductors, two of the first conductors being electrically coupled together at their ends, and a plurality of pairs of second conductors, two of the second conductors being electrically coupled together at their ends, and wherein, as conductor bundles, in each case one of the first conductors of a pair and one of the second conductors of a pair are jointly arranged on a first side of the conductor carrier and the further first conductor of the respective pair and the further second conductor of the respective pair are arranged on a second side of the conductor carrier.

15 Claims, 3 Drawing Sheets

(52) U.S. Cl.
CPC ..... *H05K 1/025* (2013.01); *H05K 2201/0191* (2013.01); *H05K 2201/097* (2013.01); *H05K 2201/09672* (2013.01)

(56) References Cited

U.S. PATENT DOCUMENTS

| | | |
|---|---|---|
| 2003/0230807 A1 | 12/2003 | Li et al. |
| 2014/0014409 A1 | 1/2014 | Lin et al. |
| 2017/0117604 A1 | 4/2017 | Kurokawa |

OTHER PUBLICATIONS

DE 102018112478.3 Office Action by the German Patent Office dated Feb. 27, 2019 in the German language.
PCT/EP2019/060904 International Search Report (in German) dated Mar. 7, 2019.
PCT/EP2019/060904 International Search Report (in English) dated Mar. 7, 2019.
English language abstract for DE2445534 (A1) dated Jan. 4, 1976 to Siemens AG.

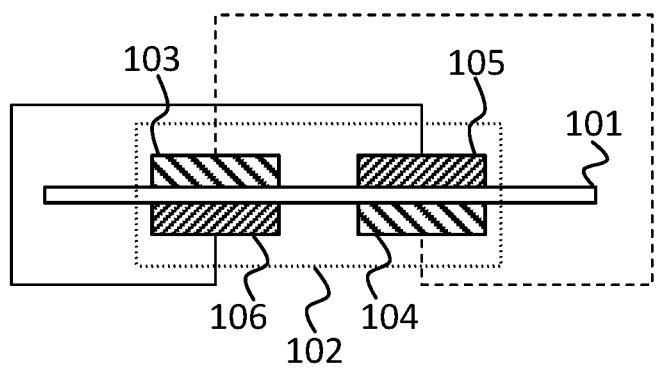
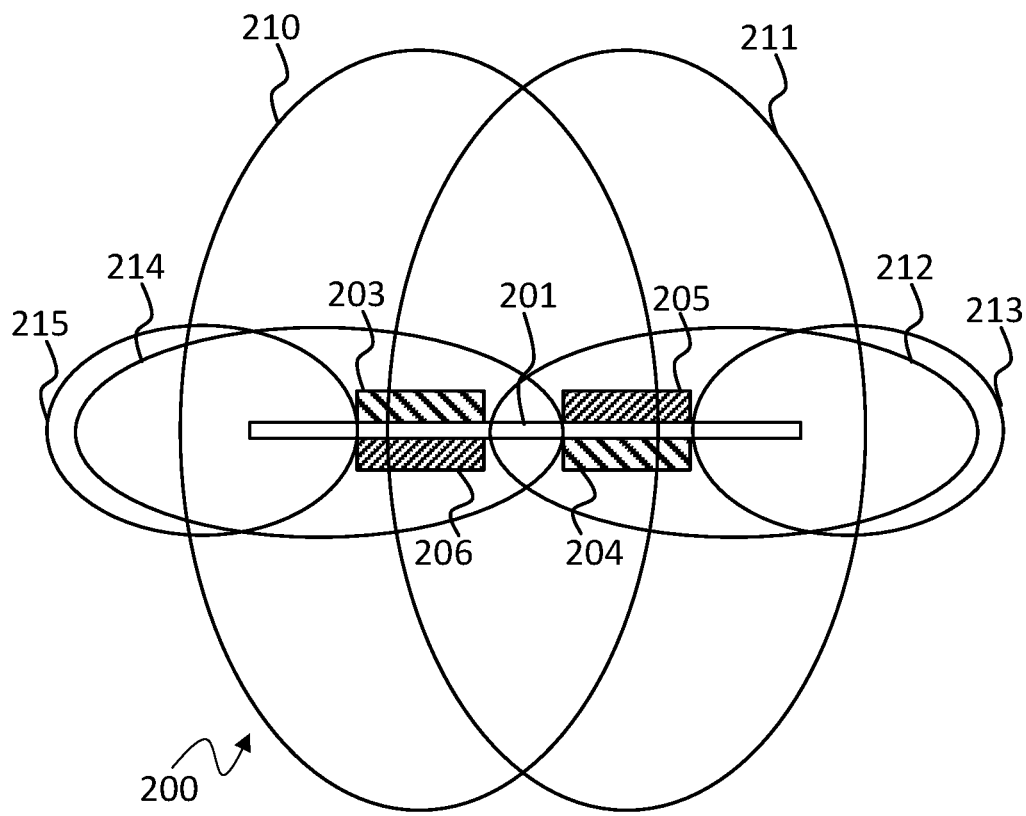
Fig. 1
Fig. 2

CONDUCTOR ARRANGEMENT AND PRODUCTION METHOD

CROSS REFERENCE TO RELATED APPLICATIONS

This application is a national phase application of International Application No. PCT/EP2019/060904, filed on 29 Apr. 2019, and claims the priority benefit of German Application 102018112478.3, filed on 24 May 2018, the content of both of which is incorporated herein by reference.

BACKGROUND OF THE INVENTION

The present invention relates to a conductor arrangement for the transmission of differential communications signals and a corresponding manufacturing process.

The present invention is described below mainly in connection with data networks in vehicles. However, it is understood that the present invention can also be used in connection with other data networks.

In modern vehicles, a large number of electronic assistance systems support the driver when operating or driving the vehicle. The increasing number of control units, sensors and actuators in the vehicle means that the demand for bandwidth for communication in the vehicle is constantly growing.

For lower data rates of up to one megabit per second, for example, the CAN-bus system has so far been used. For data rates of up to 10 megabits per second, for example, the FlexRay bus can be used. However, there is already an increased need for bandwidth for communication between the individual systems in the vehicles.

For high data rates, new bus systems will therefore find their way into board network architectures for the vehicle sector. In particular, the 1000Base-T standard, for example, in addition to the 100Base-T standard, which has already been introduced, is intended to improve backbone communication between integration computers or control devices.

Twisted pair lines or cables are used as a physical medium, for example, for CAN, or with modified lay length for CAN FD and 100BaseT-Ethernet.

For 1000Base-T, the use of a twisted pair cable is possible. However, even a small variation in the lay length can negatively affect the transmission properties. As a result, the effort required for production and testing of the corresponding lines or cables is very high.

On the basis of twisted pair technology, it is therefore not possible to apply a uniform communication medium (physical layer) including the contact system which can be used for all bus systems. Furthermore, twisted-pair lines or cables are difficult or impossible to assemble automatically.

BRIEF SUMMARY OF THE INVENTION

One object of the invention is therefore to enable data transmission at high data rates using the simplest possible means of construction in vehicles.

This task is solved by the objects of the independent claims. Advantageous further embodiments of the invention are set out in the dependent claims, the description and the accompanying figures. In particular, the independent claims of one claim set can also be further developed analogously to the dependent claims of another claim set. Objects and advantages of the disclosure embodiments may be realized and attained by the elements and combinations set forth in the claims. However, embodiments of the present disclosure are not necessarily required to achieve such exemplary objects and advantages, and some embodiments may not achieve any of the stated advantages.

A conductor arrangement for transmitting differential communication signals, according to the invention, comprises a conductor carrier, a number of pairs of first conductors, also called forward conductors, two of the first conductors being electrically coupled to each other at their ends, and a number of pairs of second conductors, also called return conductors, two of the second conductors being electrically coupled to each other at their ends. In addition, one of the first conductors of a pair and one of the second conductors of a pair are arranged together on a first side of the conductor carrier and the other first conductor of the respective pair and the other second conductor of the respective pair are arranged on a second side of the conductor carrier.

A method of manufacturing a conductor arrangement for transmitting differential communication signals, according to the invention, comprises the steps of: providing a conductor carrier, arranging a number of pairs of first conductors on the conductor carrier, arranging a number of pairs of second conductors on the conductor carrier, and electrically coupling two of the first conductors at each end thereof and two of the second conductors at each end thereof. As a conductor bundle, one of the first conductors of a pair and one of the second conductors of a pair are arranged together on first side of the conductor carrier and the further first conductor of the respective pair and the further second conductor of the respective pair are arranged on a second side of the conductor carrier.

In twisted-pair lines or cables, positive and negative field components alternate due to the twisting, so that they cancel each other out over a longer distance. This behavior is also positive with regard to susceptibility (sensitivity to interference). However, as mentioned above, even small variations in lay length can have a negative effect on the data transmission.

The present invention is based on the realization that it is difficult to ensure the quality of twisted-pair lines or cables in an electrical supply system of a vehicle.

To enable the transmission of data with high data rates, for example, according to the 1000Base-T Ethernet standard, the present invention therefore provides for an alternative conductor arrangement.

The present invention also provides the communication partners with pairs of conductors, as is the case with twisted-pair lines or cables. Consequently, the communication partners do not have to be adapted for the use of the conductor arrangement according to the invention but can be taken over unchanged.

However, the conductor arrangement according to the invention provides that two conductors are provided for each conductor of a conductor pair of a conventional twisted pair line.

For this purpose, the conductor arrangement provides pairs of first conductors, which each replace one of the conductors of a conductor pair of a conventional twisted pair line. The pairs of second conductors therefore each replace the second conductor of a pair of conductors of a conventional twisted pair line. In order to replace a line or cable with four pairs of conductors, i.e., eight conductors, the present invention in its place uses sixteen conductors.

In the conductor arrangement, the individual conductors are arranged in pairs on the conductor carrier. In this process, those conductors which together replace one of the conductor pair of a conventional twisted pair line are arranged on opposite sides of the conductor carrier.

To replace a conductor pair of a conventional twisted-pair line, two electrically coupled first conductors are therefore arranged on opposite sides of the conductor carrier. In addition, two electrically coupled second conductors are arranged on opposite sides of the conductor carrier. So, at each side of the conductor carrier, a first conductor and a second conductor form a pair. A single pair of conductors is thus represented by the present invention by a quadruple or rather by conductor bundles replaced by conductors, where conductors are arranged in pairs in different sides of the conductor carrier.

By arranging two conductors on each side of the conductor carrier, field arrangements are created which cancel each other out in the far field, similar to the fields in twisted pair lines or cables. At the same time, the immunity of the conductor arranged against external interference is increased.

Since the conductor arrangement does not have twisted conductors, there is no lay length of the individual turns. As a result, the lay length cannot vary and thus cannot have a negative effect on data transmission. At the same time, the mechanical stability of the conductor arrangement is ensured by the conductor carrier.

It is understood that the conductor arrangement, for example, may be formed as a so-called foil conductor, in which the conductor carrier comprises a flexible, electrically insulting material on which the conductors can be arranged.

Such a flexible, electrically insulating material is usually used to make flat conductors, which usually do not allow expansion (both lengthwise and widthwise). However, such conductors can be kinked or twisted or bent without damaging the cables. Consequently, such conductors can be used in a similarly flexible way as cables.

Further embodiments and developments emerge from the dependent claims as well as from the description with reference to the figures.

In one design, the first conductor and the second conductor can be arranged on opposite sides of the conductor carrier in such a way that a first conductor is always facing a second conductor in an overlapping manner.

Overlapping here means that the cross-sections of the conductors on the opposite sides of the conductor carrier are at least partially superimposed, for example, at least partially overlap. If the conductors are arranged in such a way that a first conductor, for example, on the upper side of the conductor carrier is opposite a second conductor on the lower side of the conductor carrier, a field of a first polarity is generated orthogonal to the surface of the conductor carrier.

At the same time, the second conductor on the top of the conductor carrier and the first conductor on the bottom create a field of opposite polarity orthogonal to the surface of the conductor carrier. The same applies to the fields where in the first conductor and the second conductor form on the topside of the conductor carrier and the second conductor and the first conductor on the bottom side of the conductor support laterally, for example parallel to the surface of the conductor carrier.

Consequently, fields of different polarities are superimposed both in a direction orthogonal to the surface of the conductor carrier and in a direction parallel to the surface of the conductor. Therefore, these fields cancel each other out in the far field.

In a further embodiment, the thickness of the conductor carrier can be selected depending upon a characteristic impedance predetermined for the conductor arrangement.

Typically, cables with a characteristic impedance of 100 Ohm or 120 Ohm are used in automotive applications. For a quadruple of two first and two second conductors, the characteristic impedance of the conductor arrangement is primarily determined by the distance between the conductors on the top and bottom of the conductor carrier, for example the thickness of the conductor carrier.

The characteristic impedance of the conductor arrangement can therefore be adapted to the respective requirements by a suitable choice of thickness or thickness of the conductor carrier.

In yet another embodiment, the thickness of the conductor carrier can be between 200 µm and 1000 µm, in particular between 400 µm and 600 µm.

To achieve a characteristic impedance of 100 Ohm or 120 Ohm, a thickness of the conductor carrier between 200 µm and 1000 µm is required.

For a new conductor arrangement to be designed, the characteristic impedance and thus the necessary thickness of the conductor carrier can be determined, for example, by simulating the conductor arrangement or measuring it on real prototypes.

In another embodiment, the distance between the first conductor and the corresponding second conductor on one side of the conductor carrier can be between 100 µm and 600 µm in each case.

The lateral distance between the first and second conductors arranged in pairs has a significant influence on the field effect. To set the desired field effect, the distance between the respective conductors can be adjusted accordingly.

In a still further embodiment, the conductor arrangement can have four pairs of first conductors and four pairs of second conductors.

Twisted pair cables for the High-Speed Data Link (HSD) have two shielded wire pairs. Since the conductor arrangement of the present invention of a pair of first conductors and a pair of second conductors, for example, a conductor bundle, each replaces such a conventional twisted pair conductor pair, a complete HSD line with two pairs of conductors can be completely replaced by two pairs of first conductors and two pairs of second conductors.

In one embodiment, the conductor bundles can be arranged next to each other on the conductor carrier and/or be arranged on different layers of the conductor carrier and above the other.

The arrangement of the conductor bundles on the conductor carrier can be adapted to different applications. For example, if the conductor bundles are arranged next to each other, a very flat conductor arrangement can be created. If, on the other hand, the conductor bundles are stacked on top of each other, a narrow and therefore higher conductor arrangement can be provided. Of course, two conductor bundles can also be arranged next to each other and the two pairs of conductor bundles can be arranged one above the other.

In another design, the conductor arrangement can have a jacket which encloses the conductor carrier and the conductors.

The jacket serves to mechanically stabilize the conductor arrangement. Such a jacket can, for example, be made of plastic or rubber, which protects the conductor arrangement from external influences and gives it mechanical stability. For example, the jacket can be applied in a longitudinal direction around the conductor arrangement in an extrusion process. It is understood that any other way of attaching the jacket is also possible.

It goes without saying that the conductor arrangement can be provided at its ends with plugs, contact surfaces or the like, which enable electrical contact between the individual conductors.

BRIEF DESCRIPTION OF THE SEVERAL VIEWS OF THE DRAWINGS

Further advantages features and details of the various embodiments of this disclosure will become apparent from the ensuing description of a preferred exemplary embodiment and with the aid of the drawings. The features and combinations of features recited below in the description, as well as the features and feature combination shown after that in the drawing description or in the drawings alone, may be used not only in the particular combination recited, but also in other combinations on their own, with departing from the scope of the disclosure.

In the following, advantageous examples of the invention are explained with reference to the accompanying figures, wherein:

FIG. 1 depicts a block diagram of a design example of a conductor arrangement according to the present invention;

FIG. 2 depicts a block diagram of a further design example of a conductor arrangement according to the present invention;

DETAILED DESCRIPTION OF THE INVENTION

Figure 3:
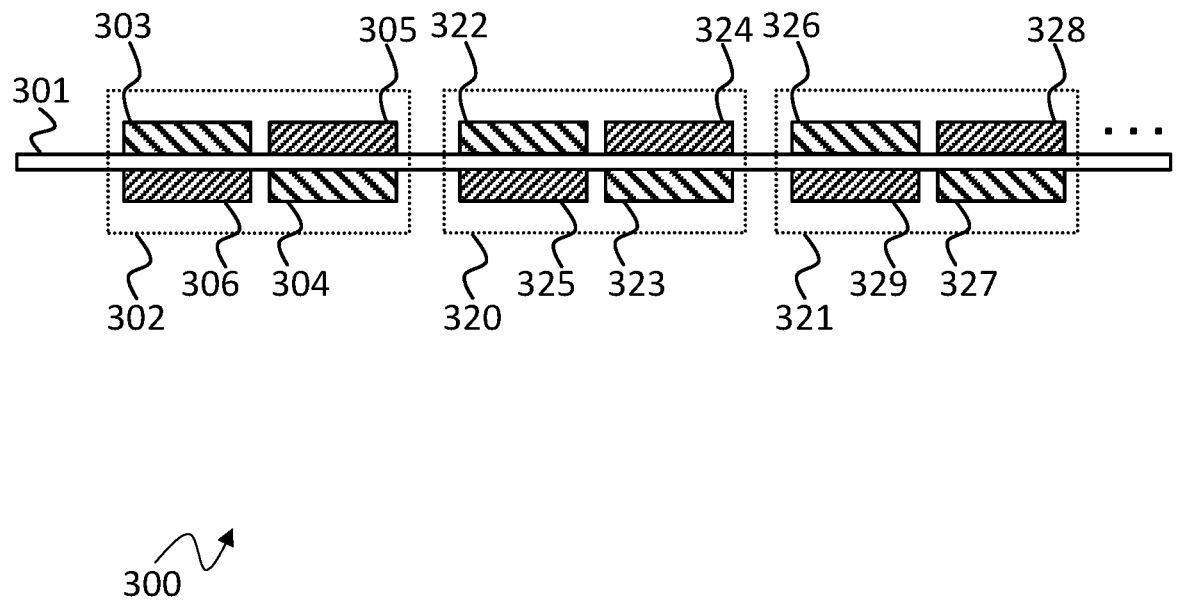
FIG. 3 depicts a block diagram of a further design example of a conductor arrangement according to the present invention.

As used throughout the present disclosure, unless specifically stated otherwise, the term "or" encompasses all possible combinations, except where infeasible. For example, the expression "A or B" shall mean A alone, B alone, or A and B together. If it is stated that a component includes "A, B, or C", then, unless specifically stated otherwise or infeasible, the component may include A, or B, or C, or A and B, or A and C, or B and C, or A and B and C. Expressions such as "at least one of" do not necessarily modify an entirety of the following list and do not necessarily modify each member of the list, such that "at least one of "A, B, and C" should be understood as including only one of A, only one of B, only one of C, or any combination of A, B, and C.

FIG. 1 depicts a block diagram of a design example of a conductor arrangement 100 in a sectional view. The conductor arrangement 100 has a conductor carrier 101. A first conductor 103 and a second conductor 105 are arranged side by side on the upper side of the conductor carrier 101. A second conductor 106 and a first conductor 104 are arranged on the underside of the conductor carrier 101. The four conductors 103, 104, 105, 106 together form a conductor bundle 102. A solid line shows that the first conductor 103 and the first conductor 104 are electrically coupled together. A dashed line shows that the second conductor 105 and the second conductor 106 are electrically coupled together. When data is transmitted via the conductor bundle 102, identical signals are present on the first conductors 103, 104 and identical signals are also present on the second conductors 105, 106.

For the conductor arrangement 100 or with the conductor bundle 102 there is a first conductor 103, 104 next to a second conductor 105, 106. At the same time, a first conductor 103, 104 and a second conductor 105, 106 are opposite each other on the top and bottom of the conductor carrier 101.

The conductor bundle 102 is used to replace a conductor pair, for example a twisted pair of a twisted pair line. As shown below, several conductor bundles 102 can be arranged on a conductor carrier 101, so that the number of parallel conductor bundles 102 can be adapted to the respective application. For example, four conductor bundles 102 can replace twisted-pair Ethernet cables with four wire pairs or eight wire pairs of conductors.

Although not shown separately, it is understood that a jacket can surround the conductor carrier 101 with the first conductors 103, 104 and the second conductors 105, 106 for protection against mechanical or other environmental influences. Such a jacket can be made for example of rubber or plastic.

If a signal is transmitted via the conductor bundle 102, the field characteristics shown in FIG. 2 will result.

FIG. 2 shows a block diagram of a further embodiment example of a conductor arrangement 200 with the resulting fields 210, 211, 212, 213, 214, 215. The conductor arrangement 200 is based on the conductor arrangement 100. Consequently, the conductor arrangement 200 also has a conductor carrier 201 with two first conductors 203, 204 and two second conductors 205, 206.

Shown are the dipole fields 210, 211, 212, 213, 214, 215, which result in vertical and horizontal directions when signals are transmitted via conductors 203, 204, 205, 206.

Since the adjacent conductors are always arranged in opposite directions, i.e., have different polarities, the resulting dipole fields 210, 211, 212, 213, 214, 215 cancel each other out in the far field, as in a twisted pair line.

FIG. 3 depicts a block diagram of another embodiment of a conductor arrangement 300 with three conductor bundles 302, 320, 321. Further conductor bundles are indicated by three points. Each of the conductor bundles 302, 320, 321 have the same structure as the conductor bundle 102 of conductor arrangement 100. Consequently, each bundle of conductors 302, 320, 321 have a first conductor 303, 322, 326 on the top of the conductor carrier 301 next to a second conductor 305, 324, 328. On the underside of the conductor carrier 301, each conductor bundle 302, 320, 321 has a second conductor 306, 325, 329 next to a first conductor 304, 323, 327.

In the conductor arrangement 300, the individual conductor bundles 302, 320, 321 are, for example, arranged next to each other on a strip-like conductor carrier 301. Needless to say, that other arrangements are also possible. For example, the conductor bundles 302, 320, 321 can also be stacked to adapt the outer geometry of the conductor arrangement to different applications.

Figure 4:
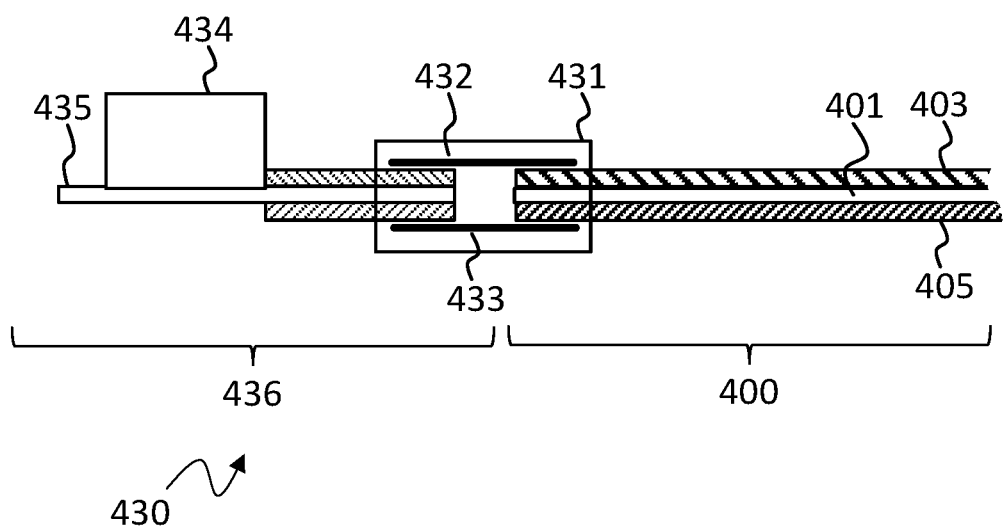
FIG. 4 depicts a block diagram of a further design example of a conductor arrangement according to the present invention.

FIG. 4 depicts a block diagram of a side view of another conductor arrangement 400 in an electronic system 430, in which the conductor arrangement 400 is coupled to a circuit 436.

The circuit 436 has, only as an example, a board 435 on which a transceiver 434 is arranged. The transceiver 434 is coupled with a plug 431, which has two contact springs 432, 433, via which the circuit 436 is coupled with the conductor arrangement 400.

The arrangement of the FIG. 4 illustrates how a conductor arrangement 400 according to the invention can be coupled with a circuit 436 without the need for separate plugs. With the conductor arrangement 400, the conductors 403, 405 are used directly as contact surfaces. The electrical contact is established via the contact springs 432, 433. Consequently, changes in characteristic impedance due to changes in symmetry are substantially less vacant than in twisted pair arrangements with conventional plugs and sockets.

The quality of the connection is therefore significantly increased with the conductor arrangement 400 as specified in the invention. Furthermore, the connection is less susceptible to external influences.

Needless to say, the electrical connection of the first conductors of the conductor arrangement 400 and the second conductors of the conductor arrangement 400 in the electronic system 430 can also be made in a circuit 436.

Figure 5:
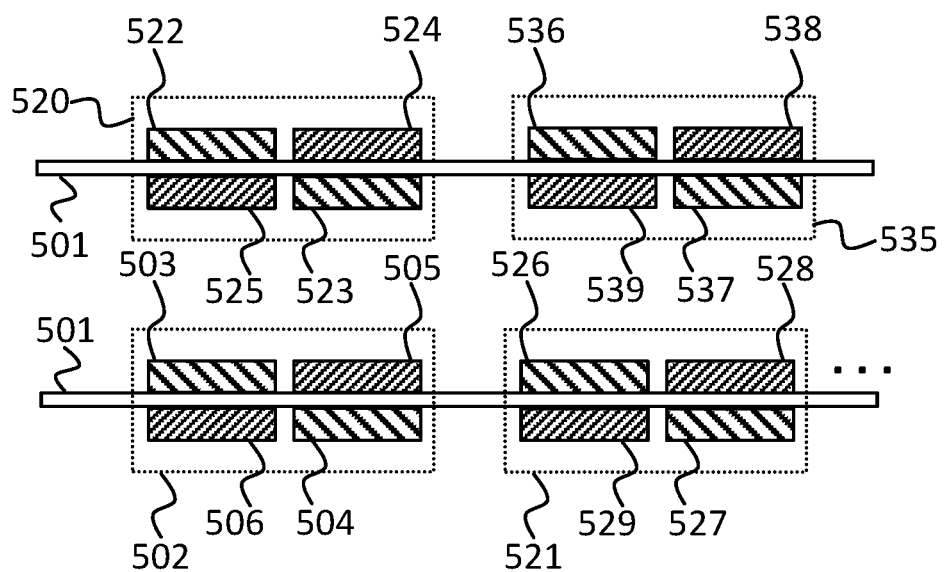
FIG. 5 depicts a block diagram of a further design example of a conductor arrangement according to the present invention.

FIG. 5 depicts a block diagram of another conductor arrangement 500. The conductor arrangement 500 has four conductor bundles 502, 520, 521, 535. In contrast to the arrangement of FIG. 3, the conductor bundles 502, 520, 521, 535 are not all arranged next to each other in the conductor arrangement 500. With the conductor arrangement 500, two conductor bundles 502, 521 and 520, 535 are arranged relatively next to each other. The conductor bundles 520, 535 are also arranged above the conductor bundles 502, 521. The conductor arrangement 500 therefore has a stacked arrangement in which two bundles of conductors 502, 521, and 520, 535 are located on each level.

Obviously, the conductor arrangements shown above are only of an exemplary nature and the conductor bundle can be arranged parallel to each other in any possible arrangement.

Figure 6:
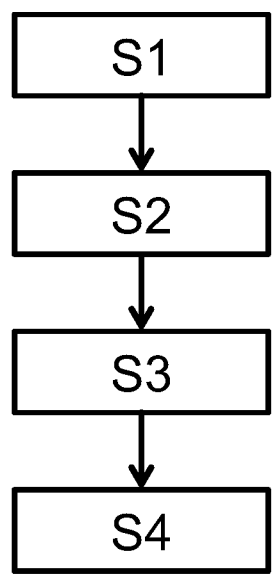
FIG. 6 depicts a flow chart of an example of a manufacturing process according to the present invention.

FIG. 6 depicts a flow chart of an example of a manufacturing process for a conductor arrangement 100, 200, 300, 400, 500 for the transmission of differential communication signals. For a better understanding the reference signs of FIGS. 1-5, are retained for reference in the following.

In a first step S1 of the provisioning, a conductor carrier 101, 201, 301, 401, 501 is provided. In a second step S2 of arranging a number of pairs of first conductors 103, 104, 203, 204, 303, 304, 322, 323, 326, 327, 403, 503, 504, 522, 523, 526, 527, 536, 537 are arranged on the conductor carrier 101, 201, 301, 401, 501. In a third step S3 a number of pairs of second conductors 105, 106, 205, 206, 305, 306, 324, 225, 328, 329, 405, 506, 507, 524, 525, 528, 529, 538, 539 are arranged on the conductor carrier 101, 201, 301, 401, 501. In a fourth step S4 of the electrical coupling, in each case two of the first conductors 103, 104, 203, 204, 303, 304, 322, 323, 326, 327, 403, 503, 504, 522, 523, 526, 527, 536, 537 are electrically coupled to each other at their ends and in each case two of the second conductors 105, 106, 205, 206, 305, 306, 324, 225, 328, 329, 405, 506, 507, 524, 525, 528, 529, 538, 539 are electrically coupled at their ends.

In the steps of arranging S2, S3, one of the first conductors 103, 104, 203, 204, 303, 304, 322, 323, 326, 327, 403, 503, 504, 522, 523, 526, 527, 536, 537 of a pair and one of the second conductors 105, 106, 205, 206, 305, 306, 324, 225, 328, 329, 405, 506, 507, 524, 525, 528, 529, 538, 539 of a pair are arranged together as a conductor bundle 102, 302, 320, 321, 502, 520, 521, 535 on a first side of the conductor carrier 101, 201, 301, 401, 501. The further first conductor 103, 104, 203, 204, 303, 304, 322, 323, 326, 327, 403, 503, 504, 522, 523, 526, 527, 536, 537 of the respective pair and the further second conductor 105, 106, 205, 206, 305, 306, 324, 225, 328, 329, 405, 506, 507, 524, 525, 528, 529, 538, 539 of the respective pair are arranged on the second side of the conductor carrier 101, 201, 301, 401, 501.

On the opposite sides of the conductor carrier 101, 201, 301, 401, 501, the first conductors 103, 104, 203, 204, 303, 304, 322, 323, 326, 327, 403, 503, 504, 522, 523, 526, 527, 536, 537 and the second conductors 105, 106, 205, 206, 305, 306, 324, 225, 328, 329, 405, 506, 507, 524, 525, 528, 529, 538, 539 can be arranged in such a way that a first conductor 103, 104, 203, 204, 303, 304, 322, 323, 326, 327, 403, 503, 504, 522, 523, 526, 527, 536, 537 each overlaps a second conductor 105, 106, 205, 206, 305, 306, 324, 225, 328, 329, 405, 506, 507, 524, 525, 528, 529, 538, 539.

To adapt the conductor arrangement 100, 200, 300, 400, 500 to different applications, the thickness of the conductor carrier 101, 201, 301, 401, 501 can be selected depending on a characteristic impedance specified for the conductor arrangement 100, 200, 300, 400, 500. For example, the thickness of the conductor carrier 101, 201, 301, 401, 501 can be selected from between 200 μm and 1000 μm.

Likewise, the distance between the first conductor 103, 104, 203, 204, 303, 304, 322, 323, 326, 327, 403, 503, 504, 522, 523, 526, 527, 536, 537 and the corresponding second conductor 105, 106, 205, 206, 305, 306, 324, 225, 328, 329, 405, 506, 507, 524, 525, 528, 529, 538, 539 on one side of the conductor carrier 101, 201, 301, 401, 501 can each be adjusted from between 100 μm and 600 μm.

To replace a conventional twisted pair cable for Ethernet, four pairs of first conductors 103, 104, 203, 204, 303, 304, 322, 323, 326, 327, 403, 503, 504, 522, 523, 526, 527, 536, 537 and four pairs of second conductors 105, 106, 205, 206, 305, 306, 324, 225, 328, 329, 405, 506, 507, 524, 525, 528, 529, 538, 539 can be arranged on the conductor carrier 101, 201, 301, 401, 501.

The geometric arrangement of the conductor bundles 102, 302, 320, 321, 502, 520, 521, 535 can be selected depending on the geometric conditions in the respective application. For example, the conductor bundles 102, 302, 320, 321, 502, 520, 521, 535 can be arranged next to each other on the conductor carrier 101, 201, 301, 401, 501 and/or different layers of the conductor carrier 101, 201, 301, 401, 501 can be arranged one above the other.

For mechanical protection, a jacket can be arranged around the conductor carrier 101, 201, 301, 401, 501 and the conductors 103, 104, 203, 204, 303, 304, 322, 323, 326, 327, 403, 503, 504, 522, 523, 526, 527, 536, 537, 105, 106, 205, 206, 305, 306, 324, 225, 328, 329, 405, 506, 507, 524, 525, 528, 529, 538, 539.

Since the devices and processes described in detail above are exemplary embodiments, they can be modified to a large extent in the usual way by a person skilled in the art without leaving the field of the invention. In particular, the mechanical arrangements and the proportions of the individual elements to each other are simply exemplary. Having described some aspects of the present disclosure in detail, it will be apparent that further modifications and variations are possible without departing from the scope of the disclosure. All matter contained in the above description and shown in the accompanying drawings shall be interpreted as illustrative and not in a limiting sense.

The invention claimed is:

1. A conductor arrangement for transmitting differential communication signals, the conductor arrangement comprising:
   a conductor carrier, a number of pairs of first conductors, wherein two of the first conductors are electrically coupled to each other at their ends, and a number of pairs of second conductors, wherein two of the second conductors are electrically coupled together at their ends, and wherein, as conductor bundles, in each case one of the first conductors of a pair and one of the second conductors of a pair are arranged jointly on a first side of the conductor carrier and the further first conductor of the respective pair and the further second conductor of the respective pair are arranged on a second side of the conductor carrier.

2. The conductor arrangement according to claim 1, wherein on opposite sides of the conductor carrier the first conductors and the second conductors are arranged in such a way that a first conductor and a second overlap alternatingly.

3. The conductor arrangement according to claim 1, wherein a thickness of the conductor carrier is selected depending on a characteristic impedance predetermined for the conductor arrangement.

4. The conductor arrangement according to claim 3, wherein the thickness of the conductor carrier is between at least one of 200 μm and 1000 μm and 400 μm to 600 μm.

5. The conductor arrangement according to claim 1, wherein a distance between the first conductor and the corresponding second conductor on one side of the conductor carrier is between 100 μm and 600 μm.

6. The conductor arrangement according to claim 1, wherein the conductor arrangement further comprises four pairs of first conductors and four pairs of second conductors.

7. The conductor arrangement according to claim 1, wherein the conductor bundles are arranged at least one of side by side on the conductor carrier and one above the other on different layers of the conductor carrier.

8. The conductor arrangement according to claim 1, further comprising a jacket enclosing the conductor carrier and the conductor.

9. A manufacturing method for a conductor arrangement for transmitting differential communication signals, the manufacturing method comprising the steps of:

providing a conductor carrier, arranging a plurality of pairs of first conductors on said conductor carrier, arranging a plurality of pairs of second conductors on said conductor carrier, and electrically coupling in each case two of the first conductors at their ends and two of the second conductors at their ends, and wherein, as conductor bundles, in each case one of the first conductors of a pair and one of the second conductors of a pair are jointly arranged on a first side of the conductor carrier and the further first conductor of the respective pair and the further second conductor of the respective pair are arranged on a second side of the conductor carrier.

10. The manufacturing method according to claim 9, wherein on opposite sides of the conductor carrier, the first conductors and the second conductors are arranged such that a first conductor overlaps with a second conductor.

11. The manufacturing method according to claim 9, wherein the thickness of the conductor carrier is selected in dependence on a characteristic impedance predetermined for the conductor arrangement and wherein the thickness of the conductor carrier is selected from a range of at least one of between 200 μm and 1000 μm and between 400 μm and 600 μm.

12. The manufacturing method according to claim 9, wherein a distance between the first conductor and the corresponding second conductor on one side of the conductor carrier is adjusted between 100 μm and 600 μm.

13. The manufacturing method according to claim 9, wherein four pairs of first conductors and four pairs of second conductors are arranged on the conductor carrier.

14. The manufacturing method according to claim 9, wherein the conductor bundles are arranged at least one of side by side on the conductor and one above the other on different layers of the conductor carrier.

15. The manufacturing method according to claim 9, wherein a jacket is arranged around the conductor carrier and the conductors.

* * * * *